United States Patent
Divakaruni et al.

(10) Patent No.: US 6,346,734 B2
(45) Date of Patent: *Feb. 12, 2002

(54) MODIFIED GATE CONDUCTOR PROCESSING FOR POLY LENGTH CONTROL IN HIGH DENSITY DRAMS

(75) Inventors: Ramachandra Divakaruni, Middletown; Mary E. Weybright, Pleasant Valley, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/325,942

(22) Filed: Jun. 4, 1999

(51) Int. Cl.⁷ .............................................. H01L 29/76
(52) U.S. Cl. ..................... 257/413; 257/412; 257/388; 257/900
(58) Field of Search ............................... 257/413, 412, 257/900, 388

(56) References Cited

U.S. PATENT DOCUMENTS 5,925,918 A * 7/1999 Wu et al. ................... 257/413

OTHER PUBLICATIONS

Wolf, Stanley, Silicon Processing for the VLSI Era, vol. 1: Process Technology, 1986, Lattice Press, pp. 386–387.*

* cited by examiner

Primary Examiner—Jerome Jackson, Jr.
Assistant Examiner—N. Drew Richards
(74) Attorney, Agent, or Firm—Wood, Phillips, VanSanten, Clark & Mortimer

(57) ABSTRACT

A semiconductor device includes a semiconductor substrate having an oxide layer thereon. A gate conductor is provided on the oxide layer, the gate conductor including a layer of polysilicon on the oxide layer, a tungsten silicide layer on the polysilicon layer, and a nitride cap layer on the tungsten silicide layer. The polysilicon layer has a length greater than length of the silicide layer and the nitride layer. Dielectric spacers on the gate conductor overlay the nitride cap layer and the tungsten silicide layer to provide a sidewall substantially flush with the polysilicon layer. Exposed polysilicon on the polysilicon layer is oxidized.

16 Claims, 2 Drawing Sheets

MODIFIED GATE CONDUCTOR PROCESSING FOR POLY LENGTH CONTROL IN HIGH DENSITY DRAMS

This application is related to the following U.S. patent applications filed on even date herewith: "METHOD FOR PROVIDING DUAL WORKFUNCTION DOPING AND PROTECTIVE INSULATING CAP", Ser. No. 09/325,941, filed Jun. 4, 1999, and "METHOD AND APPARATUS FOR PROVIDING LOW-GIDL DUAL WORKFUNCTION GATE DOPING WITH BORDERLESS DIFFUSION CONTACT", Ser. No. 09/325,943, filed Jun. 4, 1999 the Specifications of which are incorporated herein by reference.

FIELD OF THE INVENTION

This invention relates to a method of forming semiconductor devices and, more particularly, to modified gate conductor processing for polysilicon length control in high density dynamic random access memories or embedded memories.

BACKGROUND OF THE INVENTION

The channel length of the DRAM transfer gate device continues to shrink aggressively. Conventional scaling techniques are limited in their applicability for the low leakage DRAM transfer device. There is thus a need for novel integration schemes that allow for continued cell shrinkage with only limited shrinking of the channel length.

As the DRAM cell size has decreased, the transfer gate has consequently shrunk with it. Earlier cell sizes (>$8F^2$) allowed for wiggled gates to keep the array transistor off leakage to a minimum. With the onset of $8F^2$ cells with equal lines and spaces at minimum F in the wordline direction, there is a need to provide for larger transfer gate lengths of the array pass transistor by non-lithographic techniques. Conventional scaling techniques use shallow junctions (limited by surface leakage and charge writeback characteristics), high channel doping concentrations or halo implants which increase leakage and are thus not easy to incorporate in a DRAM process.

One known process is based on the BEST (BuriEd Strap) cell modified for $8F^2$. Once the trench capacitor and shallow trench isolation is formed the gate stack is put down. Typically, the gate stack consists of polysilicon and $WSi_x$ capped with SiN. During the gate mask open step, the SiN is patterned and the etch typically stops in the $WSi_x$, the resist is stripped and the remaining stack etched with the SiN as the hardmask. Post gate sidewall oxidation, the SiN spacers are put down followed by a barrier SiN film and BPSG deposition, densification and planarization. A TEOS layer is put down for the damascene bitlines and the bitline contacts are etched borderless to the gates before putting down the bitline wiring layer (generally tungsten).

The present invention is directed to further improvements in gate conductor processing.

SUMMARY OF THE INVENTION

In accordance with the invention, gate conductor processing is modified to control polysilicon length.

In accordance with one aspect of the invention, the process prevents anomalous tungsten silicide oxidation and straightening of tungsten silicide profile for improved array gap fill.

In accordance with a further aspect of the invention, the process allows for thinning of a layer of tungsten silicide by making it more tungsten rich.

In accordance with yet another aspect of the invention, the process allows for modulation of polysilicon length.

In accordance with still a further aspect of the invention, the process increases margins for borderless contact etch.

Broadly, there is disclosed herein the process of forming a semiconductor device comprising the steps of providing a semiconductor substrate having a gate dielectric thereon; forming a gate stack on the gate dielectric, the gate stack including a lower layer, and an upper layer on the lower layer; etching the upper layer completely through to the lower layer to provide a gate conductor, with the lower layer having a length greater than a length of the upper layer; and forming spacers on sidewalls of the upper layer substantially flush with the sidewalls of the lower layer.

More particularly, there is disclosed herein the process of forming a semiconductor device comprising the steps of providing a semiconductor substrate having an oxide layer thereon; forming a gate stack on the oxide layer, the gate stack including a layer of polysilicon on the oxide layer, a gate conductor material layer on the polysilicon layer, and a nitride cap layer on the gate conductor material layer; mask open etching the gate stack by patterning the nitride cap layer and etching completely through the tungsten silicide layer to provide a gate conductor; forming dielectric spacers on the gate conductor overlaying the nitride cap layer and the tungsten silicide layer; and etching the polysilicon layer forming vertical sidewalls substantially flush with the spacers to provide gate conductor sidewalls extending to the oxide layer.

It is a feature of the invention that thickness of the spacers is modulated to vary thickness of the polysilicon layer underneath.

It is another feature of the invention that the gate conductor material is a tungsten silicide layer that is relatively tungsten rich to reduce thickness of the tungsten silicide layer or lower the gate resistivity for the same thickness.

It is an additional feature of the invention that the spacers prevent anomalous gate conductor material oxidation.

It is still another feature of the invention that the gate conductor material is selected from a group consisting of tungsten silicide, tungsten nitride, tantalum silicide, tantalum silicon nitride or combinations thereof.

It is a further feature of the invention that the spacers provide straightening of the gate conductor material layer profile.

It is yet another feature of the invention that the forming step includes forming a barrier layer between the polysilicon layer and the gate conductor material layer. The barrier layer is selected from a group consisting of TiN, WN, $TaSi_2$ and TaSiN.

It is yet an additional feature of the invention that the forming step comprises depositing a layer of dielectric material over the polysilicon layer and the gate conductor. The dielectric material is selected from a group consisting of nitride, oxide, TEOS or doped oxides like ASG, BSG, PSG or BPSG. The horizontal surfaces of the dielectric layer are etched to form the spacers.

In accordance with another aspect of the invention there is disclosed a semiconductor device including a semiconductor substrate having a gate dielectric thereon. A gate conductor is provided on the gate dielectric, the gate conductor including a lower layer and an upper layer on the lower layer. The lower layer has a length greater than length of the upper layer. Spacers on sidewalls of the upper layer are substantially flush with sidewalls of the lower layer.

In accordance with still another aspect of the invention there is disclosed a semiconductor device including a semiconductor substrate having an oxide layer thereon. A gate conductor is provided on the oxide layer, the gate conductor including a layer of polysilicon on the oxide layer, a tungsten silicide layer on the polysilicon layer, and a nitride cap layer on the tungsten silicide layer. The polysilicon layer has a length greater than length of the silicide layer and the nitride layer. Dielectric spacers on the gate conductor overlay the nitride cap layer and the tungsten silicide layer to provide a sidewall substantially flush with the polysilicon layer. Exposed polysilicon on the polysilicon layer is oxidized.

More particularly, the invention relates to a process integration technique which allows for a larger gate polysilicon length for a given pitch, thus improving array device leakage (by about one generation) for a given technology. This novel integration technique allows for a larger array pass transistor length. The channel length of the pass transistor is increased by the use of SiN "prespacers" which are spacers formed before the gate polysilicon is etched. This allows for a large array polysilicon length without sacrificing the borderless bitline contact.

The modified process exercised on a 175 nm $8F^2$ cell is similar to the standard process until the gate mask open step, which is modified to etch completely through the $WSi_x$. The resist is stripped and the $WSi_x$ is annealed at about 800° C. SiN spacers are formed on the sidewall and then the polysilicon is etched. The gate sidewalls are then oxidized.

The single biggest advantage of the modified process described above is the increased gate length in the array. Increased gate length results in a tighter threshold voltage distribution and thus increased stored charge. In addition it is to be noted that since the $WSi_x$ is encapsulated in SiN and is not exposed to the oxidation, a W rich silicide or metal gate is used which allows for a lower gate sheet resistance. The $WSi_x$ anneal is needed after the mask open step to prevent anomalous $WSi_x$ oxidation which can occur in its absence during the SiN deposition.

DETAILED DESCRIPTION OF THE INVENTION

A unique and novel method of processing a semiconductor device for controlling polysilicon length in high density dynamic random access memories (DRAMs) or embedded memories is illustrated. Current processing of DRAM structures in an array directly links the lithographic dimensions to polysilicon linewidth, or length. If there is resist webbing, then the increase in the poly length is limited, which directly affects the retention of the DRAM cell. Also, the tungsten silicide ($WSi_x$)thickness is determined by sheet resistance needed for array word lines. During conventional sidewall oxidation, W rich silicides cause abnormal oxidation. Therefore, Si rich and less resistive W silicides are commonly used. In accordance with the invention, the $WSi_x$ is not exposed to sidewall oxidation. This allows for the use of more tungsten rich suicides of lower resistivity or even allows for the use of tungsten metal. This reduces the gate height. The lower stack height as well as the more straight profile of a non-oxidized $WSi_x$ layer allows improved gap fill and lower post gate conductor thermal budget for improved support device performance.

For improved borderless contact margin, since the top of a gate stack is more severely exposed to the borderless contact etch, it is preferable to have a thicker borderless contact barrier at the top compared to the bottom. For the present etches which are selective to nitride, a thicker nitride at the top is preferable.

In accordance with the invention, spacers are formed subsequent to the gate conductor mask open etch. By modulating the thickness of the spacers, the thickness of the polysilicon can be controlled. Also, since the spacers cover the $WSi_x$ layer, this layer can be more W rich and reduce stack height and avoid anomalous $WSi_x$ oxidation.

An alternative embodiment of the process may be used to form dual work function gates, as will be apparent to those skilled in the art. In brief, ASG or PSG prespacers may be used for N-type gates and BSG prespacers may be used for P-type gates.

Figure 1:
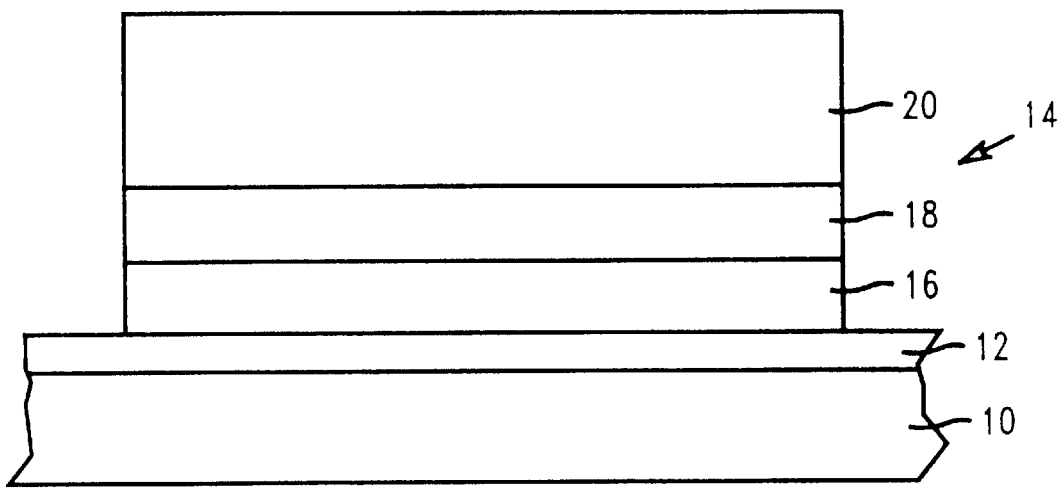
FIGS. 1–5 are a series of cross-sections illustrating a process of forming a semiconductor device in accordance with the invention.

Referring initially to FIG. 1, conventional processing is used for forming a gate conductor stack. This process is described in connection with a trench DRAM cell with self-aligned BuriEd Strap (BEST) cells discussed above. The trench capacitor and shallow trench isolation is formed in a semiconductor substrate 10. An oxide layer 12 is grown on the substrate 10. A gate stack 14 is formed on the oxide layer 12. The gate stack 14 includes a polysilicon layer 16 on the oxide layer 12, a gate conductor material layer 18 on the polysilicon layer 16, and a nitride cap layer 20 on the gate conductor material layer 18.

In the illustrated embodiment of the invention, the gate conductor material of the layer 18 comprises $WSi_x$. Alternatively, the conductive material could be tungsten nitride, tantalum silicide, tantalum silicon nitride or combinations thereof.

Figure 2:
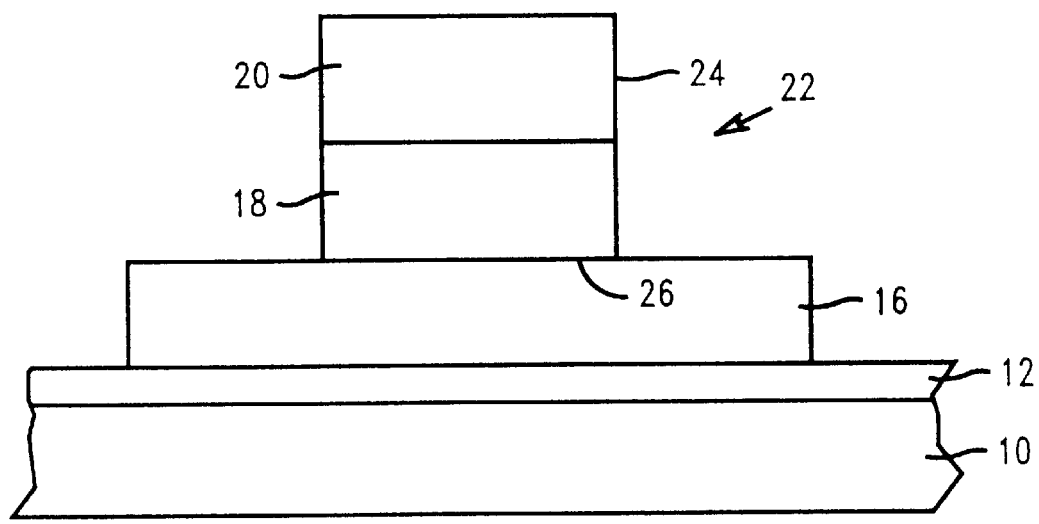

The gate stack 14 is mask open etched by patterning the nitride cap layer 20, as appropriate for a particular semiconductor device, and etching completely through the $WSi_x$ layer 18 to provide a gate conductor 22 having sidewalls 24, see FIG. 2. This etching stops on the polysilicon layer 16, as illustrated. In some instances a barrier layer, as illustrated at 26 in FIG. 2, may be present between the polysilicon layer 16 and the $WSi_x$ layer 18. The barrier layer 26 may be of, for example, TiN, WN, $TaSi_2$ or TaSiN. The mask open etch could also etch the barrier layer 26, depending on its resistance to high temperature sidewall oxidation. The etched part is protected by a subsequent nitride layer, as described below. Note that tungsten silicide may be replaced by tungsten, above.

Figure 3:
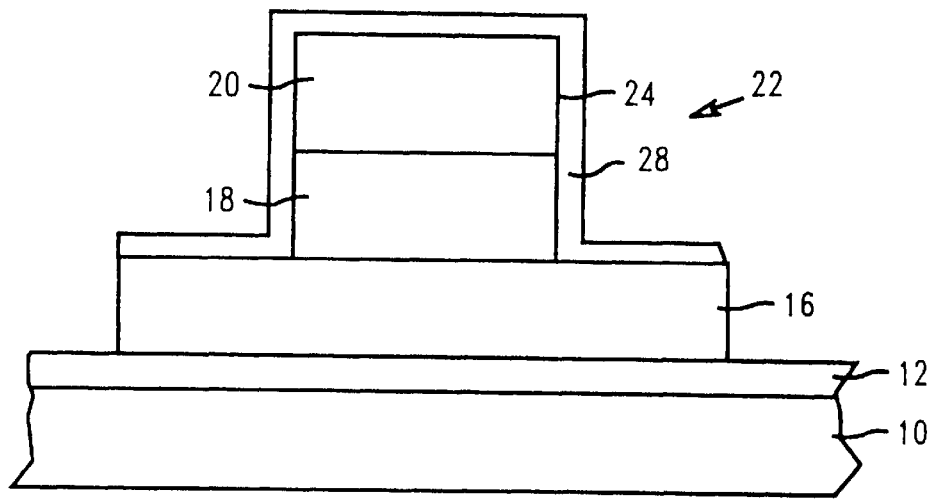

Resist used in the masked open etch is then stripped and the wafers cleaned. The $WSi_x$ is annealed at about 800° C. The $WSi_x$ anneal is needed after the mask open etch step to prevent anomalous $WSi_x$ oxidation which can occur in its absence during the subsequent deposition of a dielectric layer 28, see FIG. 3. The dielectric material could be a thin nitride layer, an oxide layer, TEOS, or doped glass oxides like ASG, BSG, PSG or BPSG. However, an oxide layer is less effective in preventing oxidation. An oxide layer may also be grown by thermal oxidation. The thickness of the dielectric layer 28 is determined by the extent to which the length of the polysilicon layer 16 is to be modulated in subsequent processing. If necessary to compensate only for the poly sidewall oxidation, for example, the thickness of the dielectric layer 28 would be the amount of polysilicon consumed.

Figure 4:
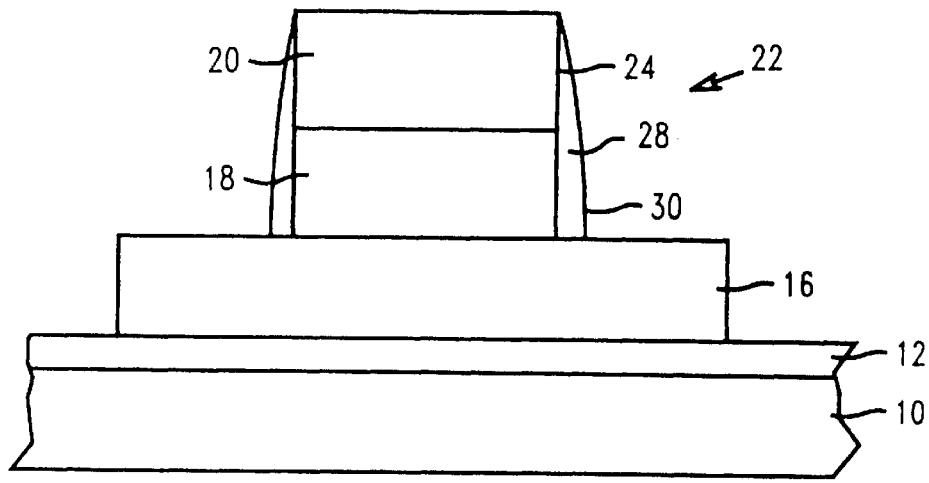

Horizontal surfaces of the thin dielectric layer 28 are etched, as shown in FIG. 4, to form dielectric spacers 30 on the gate conductor sidewalls 24. In the illustrated embodiment, the dielectric layer 28 is etched, stopping on the polysilicon layer 16. A mask may be used to block out the support device so the dielectric is broken through only in certain areas. Alternatively, the dielectric layer 28 could be etched and the polysilicon layer 16 also etched, stopping on the gate oxide layer 12. If the dielectric layer 28 is an oxide, it could easily be removed after the polysilicon layer 16 is etched. If this is a mask etch, then it could provide shorter polysilicon lengths in the supports compared to the array. Oxide spacers also provide the advantage of lower capacitance due to the bitline/contact, and since the poly etch is very selective to oxide anyway, it would provide better CD control.

Otherwise, the polysilicon layer 16 is etched separately to form vertical sidewalls 32 substantially flush with the spacers 30 to provide gate conductor sidewalls 32 extending to the oxide layer 12. The exposed polysilicon on the gate conductor sidewall 32 is oxidized as shown at 34. The spacer 30 prevents anomalous $WSi_x$ oxidation. If the support devices, for example, were blocked with the dielectric, such as nitride, on top of the polysilicon layer 16, as in FIG. 3 (they would have been blocked off by a mask during the nitride breakthrough etch in the array), the array and support side wall oxidations can be deconvolved, the support devices being formed later with a block mask, thus allowing shallower support junctions as well as good retention in the array.

A particular advantage in the process described herein is the increased gate length in the array. Increased gate length results in a tighter threshold voltage distribution, and thus increased storage charge.

Figure 5:
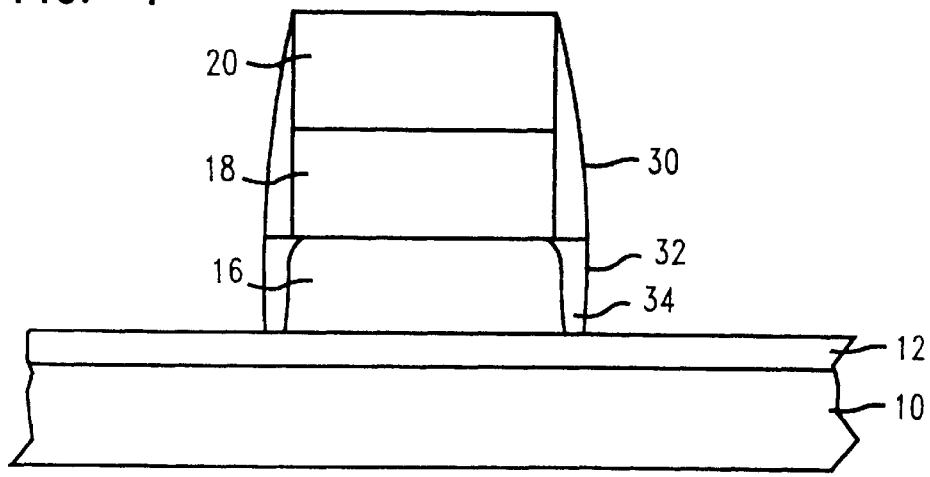

The described process is used to form a semiconductor device as illustrated in FIG. 5 in which dielectric spacers 30 on the gate conductor 22 are substantially flush with a polysilicon layer sidewall 34, the polysilicon layer having a length greater than the length of the silicide layer 18 and the nitride cap layer 20.

Thus, in accordance with the invention, modified gate conductor processing is provided for polysilicon length control in high density DRAMs or embedded memories.

We claim:

1. A semiconductor device comprising:
    a semiconductor substrate having an oxide layer thereon;
    a gate conductor on the oxide layer, the gate conductor including a layer of polysilicon on the oxide layer, a tungsten silicide layer on the polysilicon layer and a nitride cap layer on the tungsten silicide layer, the polysilicon layer having a length greater than length of the sidicide layer and the nitride layer;
    dielectric spacers on the gate conductor sidewalls overlaying the nitride cap layer and the tungsten silicide layer to provide a sidewall substantially flush with the polysilicon layer; and
    exposed polysilicon in the polysilicon layer being oxidized,
    wherein the tungsten silicide layer comprises an annealed tungsten silicide layer to prevent oxidation of the tungsten silicide by the dielectric spacers.

2. The semiconductor device of claim 1 wherein thickness of the spacers is modulated to vary thickness of the polysilicon layer.

3. The semiconductor device of claim 1 wherein the tungsten silicide layer is tungsten rich to reduce thickness of the tungsten silicide layer or reduce gate resistivity.

4. The semiconductor device of claim 1 wherein the spacers prevent anomalous tungsten silicide oxidation.

5. The semiconductor device of claim 1 wherein the spacers provide straightening of the tungsten silicide layer profile.

6. The semiconductor device of claim 1 further comprising a barrier layer between the polysilicon layer and the tungsten silicide layer.

7. The semiconductor device of claim 6 wherein the barrier layer is selected from a group consisting of TiN, $TaSi_2$, WN and TaSiN.

8. The semiconductor device of claim 1 wherein the spacers are of a dielectric material selected from a group consisting of nitride, oxide, TEOS or doped glass.

9. The semiconductor device of claim 1 wherein the dielectric spacers comprise an oxide layer grown on the gate conductor side walls overlaying the nitride cap layer and the tungsten silicide layer.

10. A semiconductor device comprising:
    a semiconductor substrate having an oxide layer thereon;
    a gate conductor on the oxide layer, the gate conductor including a layer of polysilicon on the oxide layer, a tungsten silicide layer on the polysilicon layer and a nitride cap layer on the tungsten silicide layer, the polysilicon layer having a length greater than length of the silicide layer and the nitride layer;
    dielectric spacers on the gate conductor sidewalls overlaying the nitride cap layer and the tungsten silicide layer to provide a sidewall substantially flush with the polysilicon layer, wherein the dielectric spacers comprise an oxide layer grown on the gate conductor side walls overlaying the nitride cap layer and the tungsten silicide layer; and
    exposed polysilicon in the polysilicon layer being oxidized.

11. The semiconductor device of claim 10 wherein thickness of the spacers is modulated to vary thickness of the polysilicon layer.

12. The semiconductor device of claim 10 wherein the tungsten silicide layer is tungsten rich to reduce thickness of the tungsten silicide layer or reduce gate resistivity.

13. The semiconductor device of claim 10 wherein the spacers prevent anomalous tungsten silicide oxidation.

14. The semiconductor device of claim 10 wherein the spacers provide straightening of the tungsten silicide layer profile.

15. The semiconductor device of claim 10 further comprising a barrier layer between the polysilicon layer and the tungsten silicide layer.

16. The semiconductor device of claim 10 wherein the barrier layer is selected from a group consisting of TiN, $TaSi_2$, WN and TaSiN.

* * * * *